(12) United States Patent
Iijima et al.

(10) Patent No.: US 7,248,222 B2
(45) Date of Patent: Jul. 24, 2007

(54) HIGH-FREQUENCY MODULE

(75) Inventors: Shinya Iijima, Kawasaki (JP);
Tomoyuki Abe, Kawasaki (JP);
Nobuyuki Hayashi, Kawasaki (JP);
Yoji Ohashi, Kawasaki (JP); Toshihiro Shimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 220 days.

(21) Appl. No.: 11/167,568

(22) Filed: Jun. 28, 2005

(65) Prior Publication Data
US 2007/0013581 A1    Jan. 18, 2007

(30) Foreign Application Priority Data
Mar. 15, 2005    (JP)    ............... 2005-072968

(51) Int. Cl.
*H01Q 1/38*    (2006.01)
(52) U.S. Cl. ............... 343/700 MS; 342/175; 333/247
(58) Field of Classification Search ......... 343/700 MS; 342/175, 70; 333/247, 260
See application file for complete search history.

(56) References Cited
U.S. PATENT DOCUMENTS
5,657,024 A    8/1997  Shingyoji et al.
6,356,173 B1 *  3/2002  Nagata et al. ............... 333/247
2002/0158722 A1 * 10/2002  Maruhashi et al. ......... 333/246
2004/0239453 A1 * 12/2004  Sasada ..................... 333/219.1

FOREIGN PATENT DOCUMENTS
EP    1 274 149 A2    1/2003
JP    8-114667         5/1996
JP    2003-86728       3/2003

* cited by examiner

*Primary Examiner*—Hoang V. Nguyen
(74) *Attorney, Agent, or Firm*—Westerman, Hattori, Daniels & Adrian, LLP.

(57) ABSTRACT

A high-frequency module includes a stiffener (a support substrate), a resin base member of which one surface is fixed to the stiffener, a first conductive pattern formed on said one surface of the resin base member, a second conductive pattern formed on the other surface of the resin base member for constituting a waveguide in combination with the first conductive pattern to pass a high-frequency signal through the resin base member and including a window for allowing the high-frequency signal to pass therethrough, a cap for covering a semiconductor element and for absorbing or reflecting the high-frequency signal, an adopter (a waveguide tube) fixed onto the second conductive pattern such that one open end thereof surrounds the window, and an antenna fixed to the other open end of the adaptor.

10 Claims, 12 Drawing Sheets

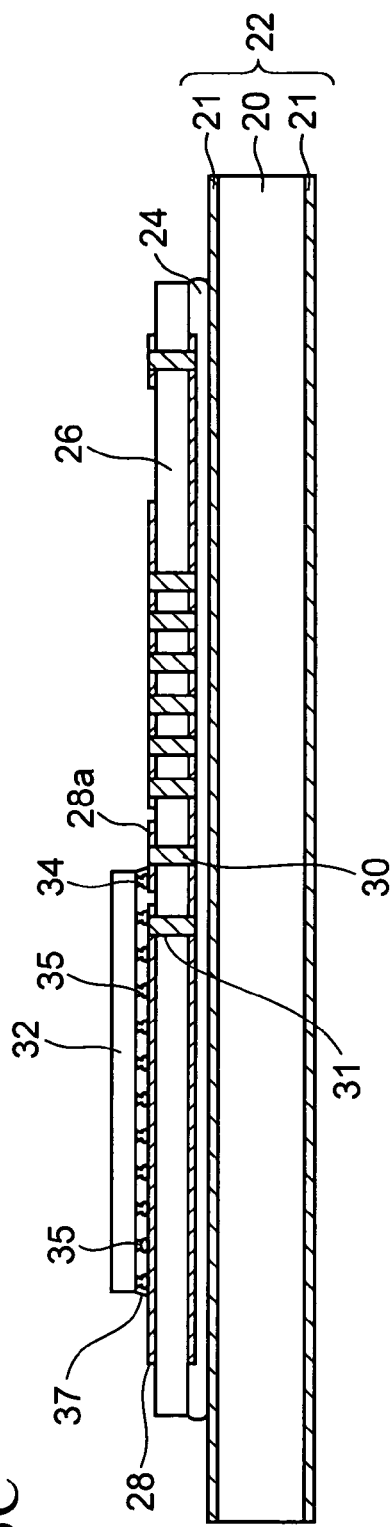
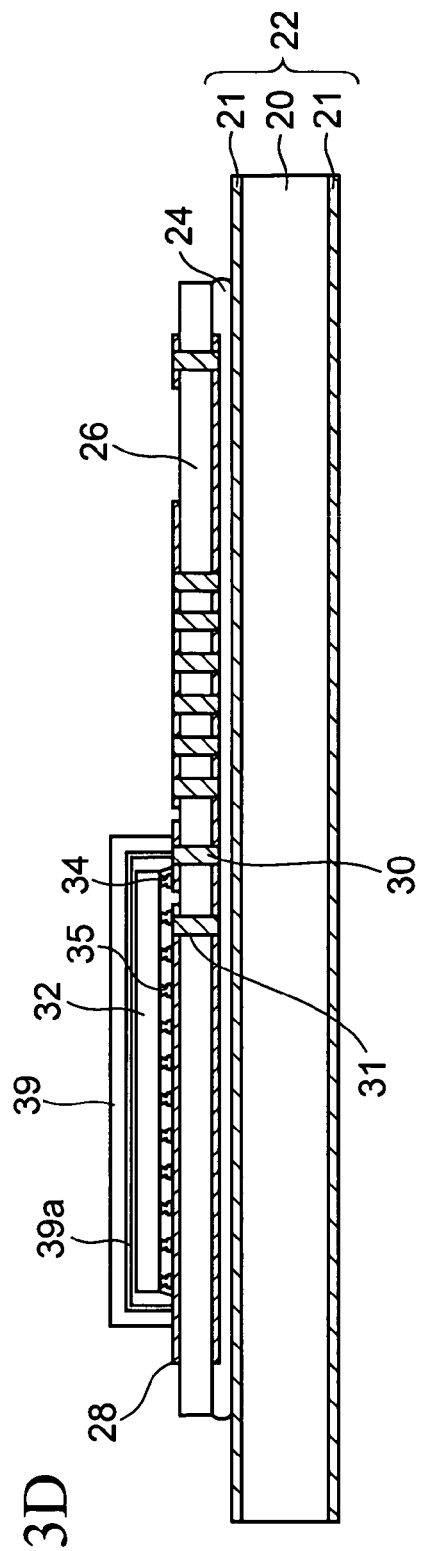
FIG. 3C
FIG. 3D

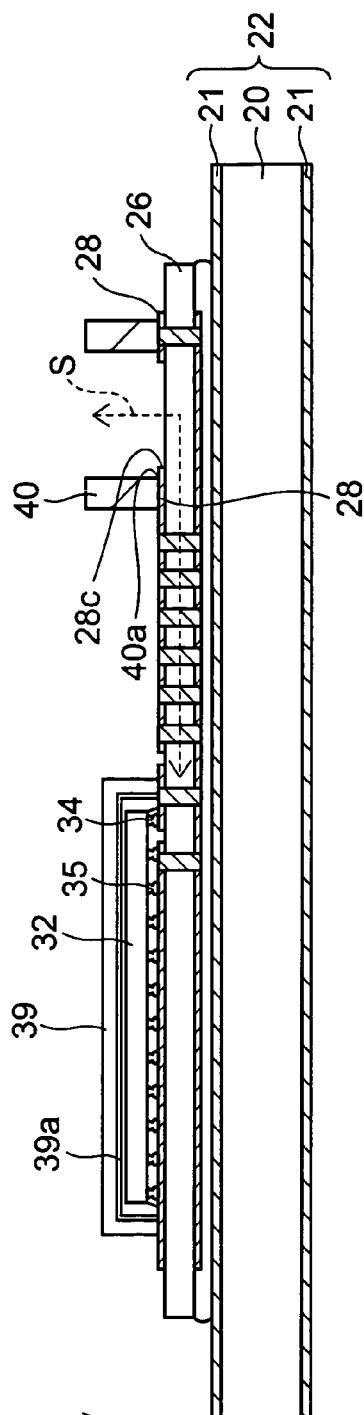
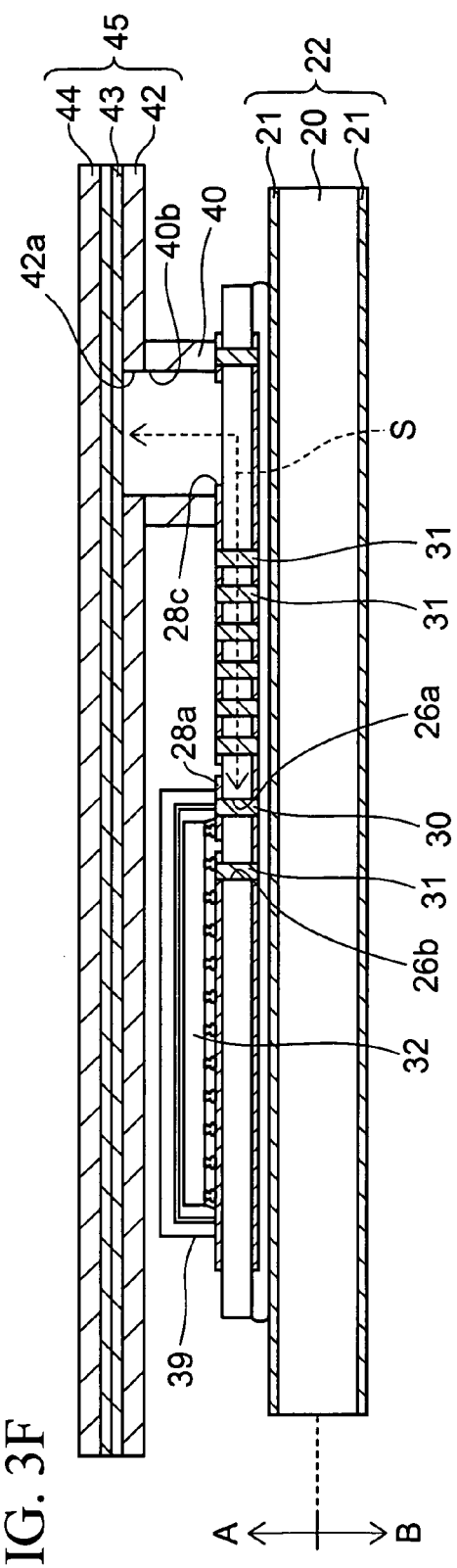

HIGH-FREQUENCY MODULE

CROSS-REFERENCE TO RELATED APPLICATIONS

This application is based on and claims priority of Japanese Patent Application No. 2005-072968 filed on Mar. 15, 2005, the entire contents of which are incorporated herein by reference.

BACKGROUND OF THE INVENTION

1. Field of the Invention

The present invention relates to a high-frequency module.

2. Description of the Related Art

An in-vehicle radar device to be mounted on an automobile uses a high-frequency module which is operated in a millimeter wave range. The in-vehicle radar is widespread for the purpose of measuring a distance to an automobile which is running ahead, for instance. An example of the in-vehicle radar device is disclosed in Patent Literature 1.

In the Patent Literature 1, an active element such as a monolithic microwave integrated circuit (MMIC) is mounted on one surface of a metal substrate via a circuit substrate, and an antenna for transmitting and receiving a high-frequency signal is provided on the other surface of the metal substrate. In this structure, it is necessary to form a hole in the metal substrate so as to constitute a waveguide tube for guiding the high-frequency signal from the antenna to the active element. According to the Patent Literature 1, manufacturing time for the high-frequency module is reduced by forming the hole as the waveguide tube on the metal substrate while the circuit substrate is attached to the metal substrate.

Meanwhile, Patent Literature 2 discloses an FM radar module configured to connect an MMIC to an antenna so as to carry a high frequency by use of a pin.

However, forming the hole in the metal substrate requires a high cost. Accordingly, formation of the through hole serving as the waveguide tube in the metal substrate as disclosed in Patent Literature 1 incurs an increase in manufacturing costs of the high-frequency module.

(Patent Literature 1) Japanese Unexamined Patent Publication No. 2003-86728

(Patent Literature 2) Japanese Unexamined Patent Publication No. 8(1996)-114667

SUMMARY OF THE INVENTION

According to one aspect of the present invention, there is provided a high-frequency module comprising: a support substrate; a resin base member whose one surface is fixed to the support substrate; a first conductive pattern formed on said one surface of the resin base member; a second conductive pattern formed on the other surface of the resin base member, the second conductive pattern constituting a waveguide in corporation with the first conductive pattern to pass a high-frequency signal in the resin base member and including a window for allowing entrance and exit of the high-frequency signal; a semiconductor element, either transmitting or receiving the high-frequency signal, mechanically and electrically connected onto the second conductive pattern at an interval from the window; a waveguide tube fixed onto the second conductive pattern such that one open end thereof surrounds the window; and an antenna fixed to the other open end of the waveguide tube.

According to the present invention, the semiconductor element and the antenna are placed on the same side when viewed from the support substrate. Therefore, the waveguide tube for guiding the high-frequency signal transmitted or received by the semiconductor element to the antenna can be placed on the above same side. For this reason, unlike the case of placing the semiconductor element and the antenna on different sides of the support substrate, it is not necessary in the present invention to form a through hole for inserting the waveguide tube in the support substrate. In this way, it is not necessary to form the through hole with high cost, which in turn lowers the manufacturing cost.

Moreover, since the resin base member, on which the semiconductor element is mounted, costs lower than a ceramic substrate, it is possible to reduce the cost as compared to the case of using the ceramic substrate.

The resin base member has a lower dielectric constant as compared to the ceramic substrate. Accordingly, in order to obtain the same characteristic impedance as that of the ceramic substrate, it is necessary to form the resin base member thinner than the ceramic substrate. In the present invention, the resin base member is supported by the support substrate even when the thin resin base member is used. Therefore, it is possible to maintain fine flatness of the resin base member and to connect the semiconductor element reliably to the second conductive pattern on the resin base member.

In addition, the first and second conductive patterns on both surfaces of the resin base member cooperatively constitute the waveguide, and the high-frequency signal transmitted and received by the semiconductor element is allowed to pass through the waveguide. Accordingly, it is possible to reduce signal losses as compared to the case of passing the high-frequency signal through a line or a wire.

Although planar shapes of the first and second conductive patterns are not particularly limited, the second conductive pattern preferably includes an aperture formed away from the window, and an island surrounded by the aperture. In this case, a high-frequency signal terminal of the semiconductor element is bonded to the island.

Meanwhile, it is also possible to form a first through hole for a high-frequency signal in the resin base member below this island, and to form a first conductor for a high-frequency signal in the first through hole so as to electrically connect the island to the first conductive pattern.

As described above, even when the first through hole is formed in the resin base member, it is possible to form the through hole in the resin base member at a substantially lower cost than for a ceramic substrate. Accordingly, it is possible to reduce the manufacturing costs significantly as compared to the case of using the ceramic substrate.

In addition, it is preferable to form a plurality of second through holes along both sides of the waveguide, and to form second conductors in the second through holes. The second conductors function as a side wall of the waveguide, for example.

As described previously, even when the second through holes are formed in the resin base member, the cost for forming it in the resin base member is less expensive than that for the ceramic substrate. Accordingly, it is possible to avoid an increase in the manufacturing costs.

BRIEF DESCRIPTION OF THE DRAWINGS

FIGS. 3A to 3F are cross-sectional views showing progress of manufacturing a high-frequency module according to an embodiment of the present invention;

DESCRIPTION OF THE PREFERRED EMBODIMENT

(1) Preliminary Explanation

Preliminary explanation of the present invention will be made herein prior to explaining the preferred embodiment of the present invention.

Figure 1:
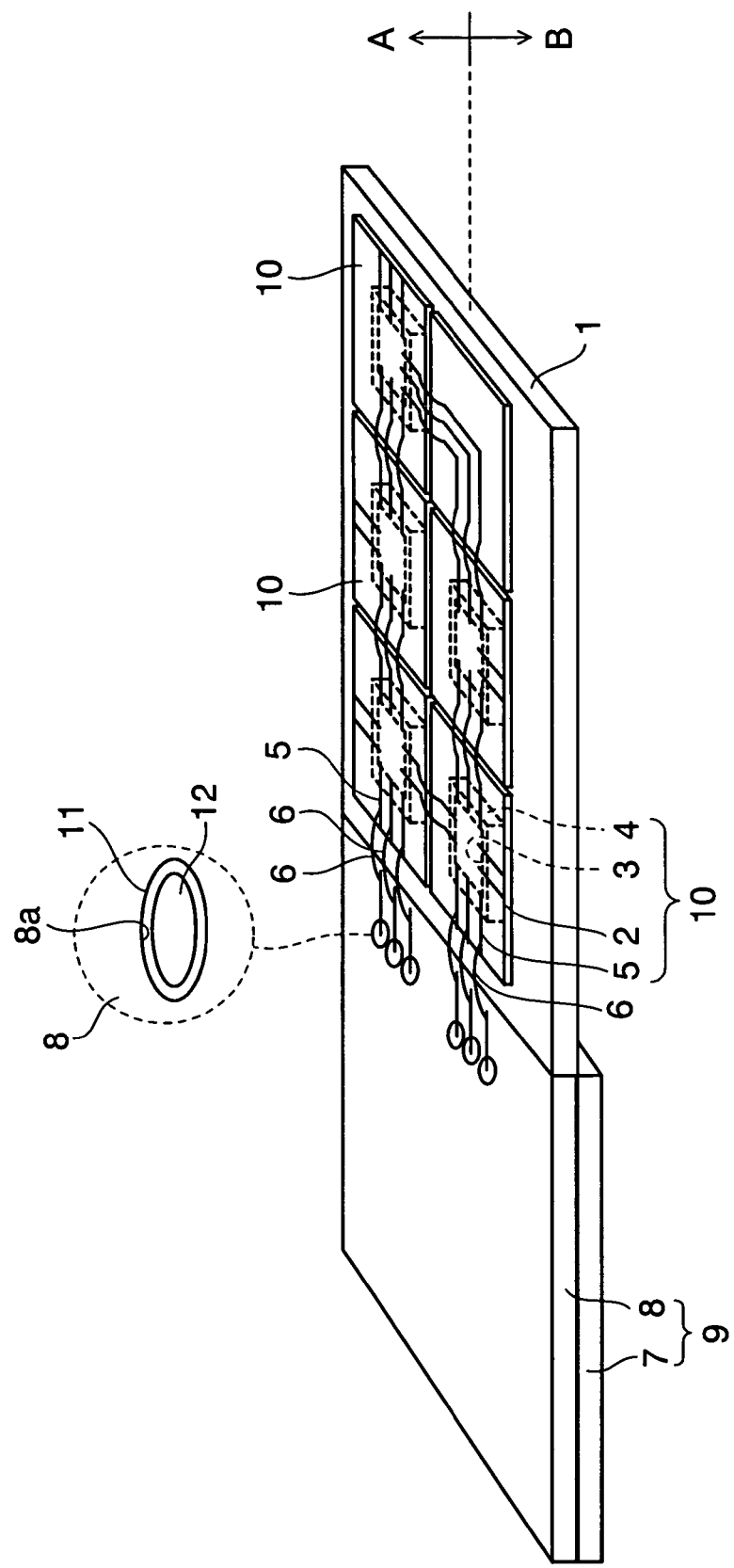
FIG. 1 is a perspective view of a hypothetical high-frequency module.

FIG. 1 is a perspective view of a hypothetical high-frequency module.

In this high-frequency module, a plurality of unillustrated concave portions are formed in a chassis 1 made of an aluminum plate, and a plurality of high-frequency semiconductor devices 10 are fixed to the respective convex portions. Moreover, an antenna module 9 including an antenna 7 made of aluminum, and a support plate 8 made of an aluminum plate provided with waveguide tubes 8a, is disposed beside the chassis 1.

A side wall of each of the waveguide tubes 8a is covered with a Teflon tube 11, and a conductor 12 such as gold is filled in the tube 11. The conductors 12 are electrically connected to lines 5 of the high-frequency semiconductor devices 10 through gold ribbons 6.

In this high-frequency module, a radar high-frequency signal generated in the high-frequency semiconductor device 10 is transmitted to a radar module 9 through the gold ribbon 6, and a radar is irradiated from the radar module 9 onto a target (such as an automobile). Moreover, the radar reflected by the target is received by the antenna 7 of the radar module 9, and the received signal is then processed by the high-frequency semiconductor device 10 to calculate a distance from the target, for example.

Here, the high-frequency signals generated by the high-frequency semiconductor devices 10 need to be supplied to the antenna 7 so that transmission losses are reduced as small as possible. Accordingly, in the example shown in FIG. 1, instead of placing the antenna 7 in the same side A as the semiconductor devices 10 when seen from the chassis 1, the antenna 7 is placed on the opposite side B to the semiconductor devices 10 so as to minimize traveling distances of the high-frequency signals and thereby to reduce losses.

Figure 2:
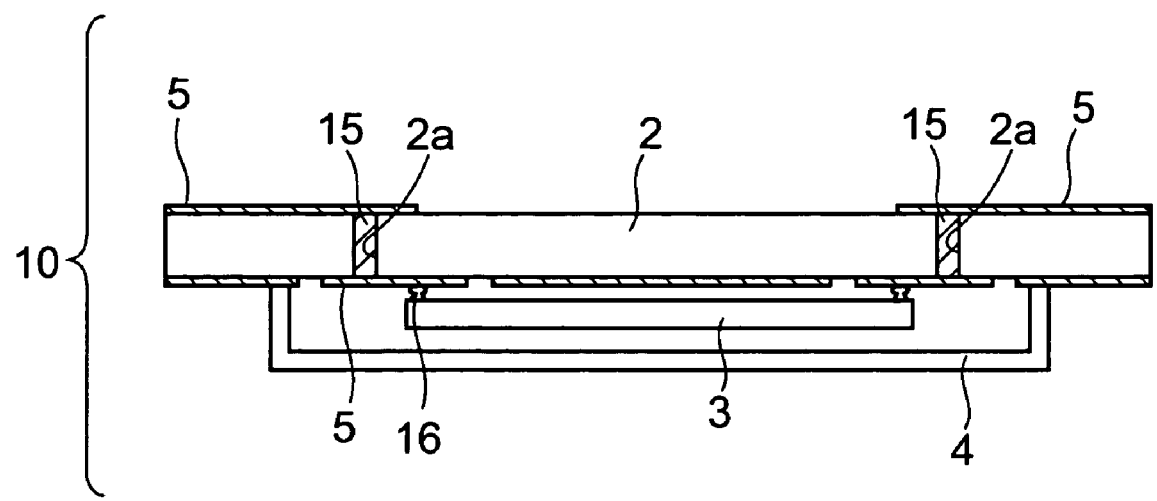
FIG. 2 is a cross-sectional view of a semiconductor device to be mounted on the hypothetical high-frequency module shown in FIG. 1.

Meanwhile, FIG. 2 is a cross-sectional view of the above-described high-frequency semiconductor device 10.

As shown in the drawing, the high-frequency semiconductor device 10 is formed by mounting a semiconductor element 3 on a ceramic substrate 2 with bumps 16 interposed therebetween, and the semiconductor element 3 is covered with a cap 4. The semiconductor element 3 is, for example, a monolithic microwave integrated circuit (MMIC), which is fabricated by forming an active element such as a transistor and a passive element such as a resistive element integrally on a common substrate made of silicon or gallium arsenide.

Here, the cap 4 is provided for preventing the high-frequency signal generated by the semiconductor element 3 from leaking out. The cap 4 is made of a material which can absorb high-frequency signals.

Moreover, since the above-described high-frequency signal needs to be taken out of the cap 4, through holes 2a are formed in the ceramic substrate 2, and conductors 15 for taking the high-frequency signal out to the lines 5 on a surface of the ceramic substrate 2 on the opposite side to the semiconductor element 3 are buried in the through holes 2a.

In the above-described hypothetical high-frequency module, unlike the Patent Literature 1, it is not necessary to form a hole serving as a waveguide tube in the chassis 1.

Nevertheless, in this example, the high-frequency signal generated by the semiconductor element 3 must be taken out to the surface of the ceramic substrate 2 on the opposite side to the semiconductor element 3 as shown in FIG. 2. Accordingly, it is necessary to form the through holes 2a in the ceramic substrate 2.

However, a process for forming the through holes in the ceramic substrate 2 is performed when sintering a green sheet which is a starting material of ceramic. Accordingly, the process of forming the through holes requires a long process time and eventually requires a high cost. In addition, it is difficult to control processing accuracy of the through holes 2 because of thermal contraction in the sintering process. Accordingly, there is a limitation for forming the through holes 2a with a high degree of accuracy.

Due to the above-described reason, the structure requiring the through holes 2a as shown in FIG. 2 causes an increase in manufacturing costs of the high-frequency module. In addition, it is difficult to guarantee high processing accuracy of the through holes 2.

Moreover, in the example shown in FIG. 1, the antenna 7 is connected to the semiconductor device 10 with the gold ribbon 6 so as to carry a high frequency. However, the high-frequency signal is apt to leak out of the gold ribbon 6. Accordingly, there is also a problem that the gold ribbon 6 increases high-frequency signal losses.

To solve these problems, the inventor of the present invention thinks out the following embodiment of the present invention.

(2) Preferred Embodiment of the Invention

Next, a high-frequency module according to an embodiment of the present invention will be described in detail while tracing a manufacturing process thereof. Note that a high-frequency signal will hereinafter represent a signal in a millimeter waveband having a wavelength in a range from 1 to 10 mm.

FIGS. 3A to 3F are cross-sectional views showing the high-frequency module according to the embodiment of the present invention in the course of manufacturing.

First, a process for obtaining a cross-sectional structure shown in FIG. 3A will be described.

A prepregs, which is plain-woven glass cloth impregnated with epoxy resin, are prepared. Then, the prepregs are stacked into a thickness of about 3 mm to form a core base member 20. Alternatively, it is also possible to form the core base member 20 by use of a material having low thermal expansion and high elasticity such as FR4 (an epoxy resin laminate material).

Subsequently, copper foils having a thickness of 18 μm, for example, are attached to both surfaces of this core base member 20 as metal foils 21, and the core base member 20 and the metal foils 21 are made into a stiffener (a support substrate) 22. In addition to the copper foils, it is also possible to use aluminum foils, nickel foils, and gold foils as the metal foils 21. However, in light of low costs and process stability, the copper foils are most suitable for the metal foils 21.

Here, instead of forming the metal foils 21, it is also possible to form the stiffener 22 solely by use of a ceramic plate or a metal plate such as a 42 alloy.

In addition, when it is possible to obtain sufficient rigidity solely from the core base member 20, the metal foils 21 on the both surfaces may be omitted.

Then, apart from the stiffener 22, a double-sided copper-clad base member is prepared by forming metal lamination films on both surfaces of a resin base member 26 having a thickness of about 0.4 mm. Here, each metal lamination film is formed by laminating a gold film, a nickel film, and a copper film in this order. The thickness of each of the films constituting the metal lamination film is not particularly limited. However, in this embodiment, the gold film is set to about 0.5 μm, the nickel film is set to about 3 μm, and the copper film is set to about 18 μm. Here, as the high-frequency module according to this embodiment is used in a millimeter waveband, it is preferable to form the resin base member 26 by use of a material having a dielectric loss tangent smaller than 0.01 in the millimeter waveband. Such a material may be SB (styrene-butadiene), PPE (polyphenylene ether), PTFE (Teflon), BT resin (made by Mitsubishi Gas Chemical Company, Inc.), LCP (liquid crystal polymer), cyanate ester resin, PEEK (polyether ether ketone) resin, PPO (polyphenylene oxide) resin or BCB (benzocyclobutene) resin, for example.

Thereafter, a hole forming process is performed for the double-sided copper-clad base member to form first and second through holes 26a and 26b. This hole forming process is performed by use of a machine drill or by irradiating a laser, for example. In either case of using the machine drill or laser irradiation, the hole forming process is completed in a short time. Accordingly, it is possible to significantly reduce a cost required for the process as compared to the hole forming process in a ceramic substrate. Moreover, it is difficult to guarantee the accuracy of the hole forming process for the ceramic substrate because of thermal contraction of the substrate. On the contrary, the resin base member 26 does not cause such thermal contraction in the hole forming process. Accordingly, it is possible to form the respective through holes 26a and 26b at high accuracy as compared to the ceramic substrate.

Here, a diameter of each of the through holes 26a and 26b is set equal to or below 200 μm in this embodiment.

Subsequently, electrolytic copper plating films are formed on respective surfaces of the first and second through holes 26a and 26b and the metal lamination films. Then, conductive paste is filled in the respective through holes 26a and 26b, and first and second conductors 30 and 31 are formed by heating and hardening the conductive paste.

In this embodiment, the first conductor 30 is used for inputting and outputting a high-frequency signal to and from a semiconductor element to be described later. Only one first conductor 30 is formed herein. On the contrary, the plurality of second conductors 31 are formed herein, and are used for setting electric potential of ground bumps of the semiconductor element to ground potential.

Next, the metal lamination films and the electrolytic copper plating film described above are patterned by photolithography, thereby forming a first conductive pattern 27 on one surface 26c of the resin base member 26 and forming a second conductive pattern 28 on the other surface 26d.

The first and second conductive patterns 27 and 28 thus formed are electrically connected to each other by the above-described first and second conductors 30 and 31.

Figure 3A:
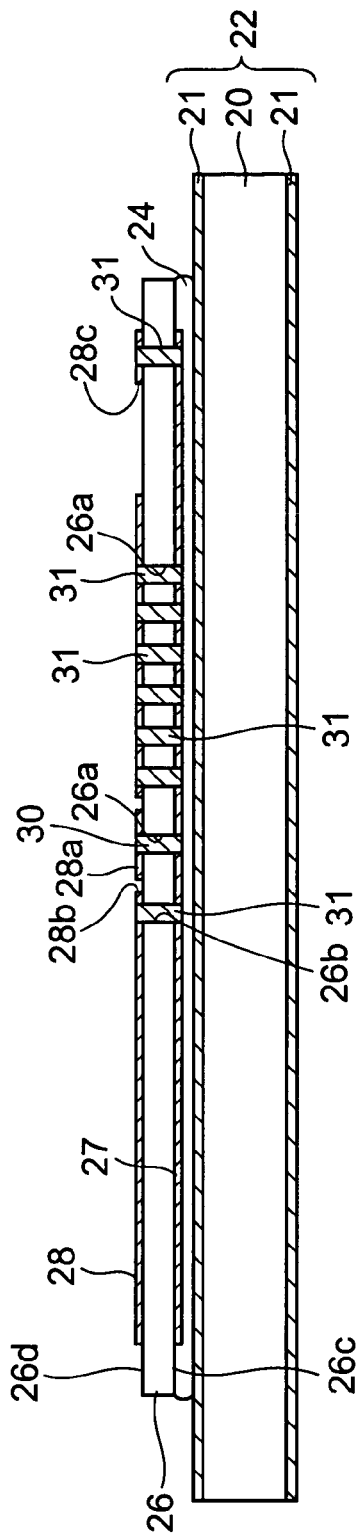
Figure 4:
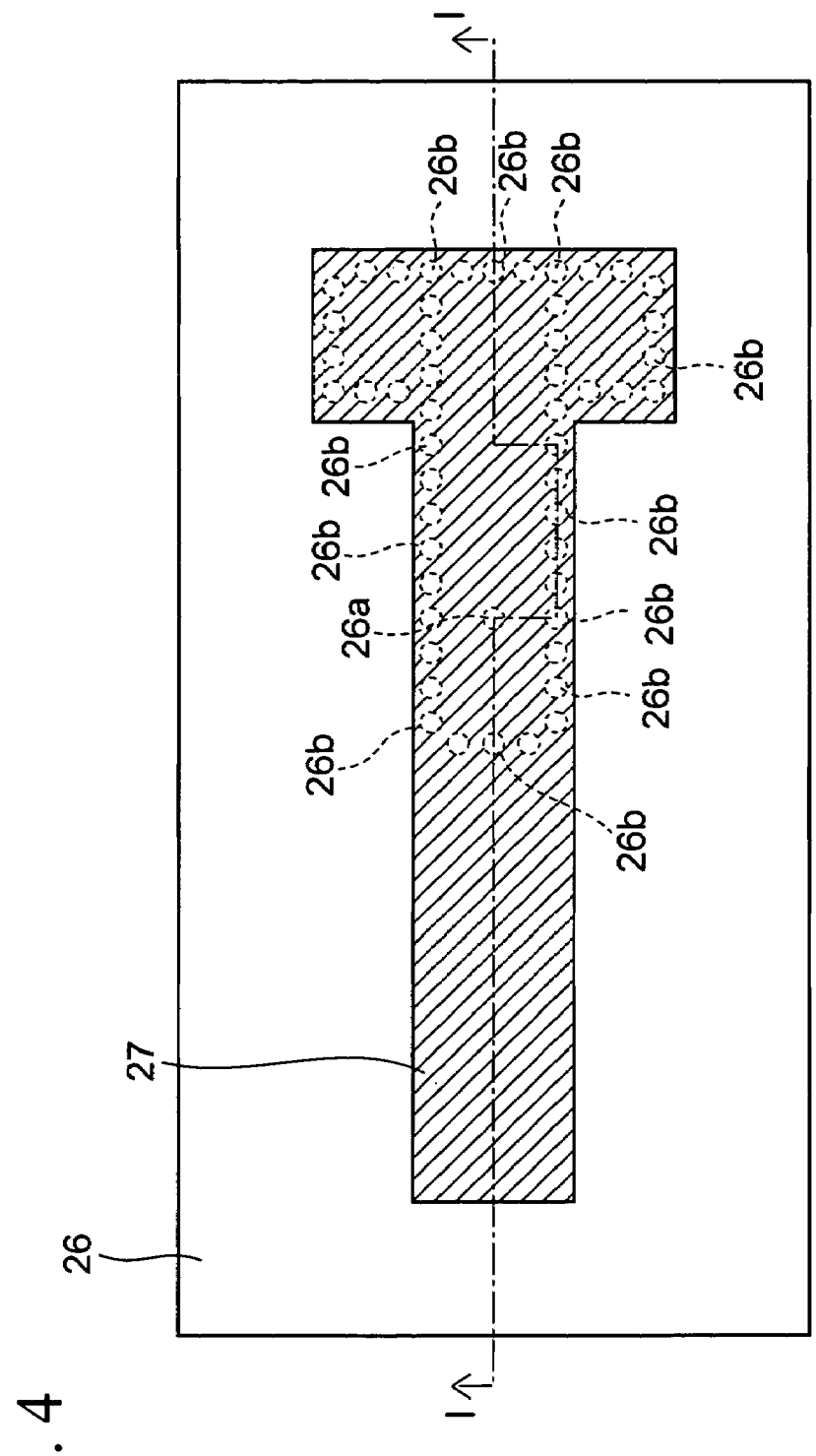
FIG. 4 is a plan view of a first conductive pattern of the high-frequency module according to the embodiment of the present invention.

FIG. 4 is a plan view of the above-described first conductive pattern 27, and the above-described FIG. 3A corresponds to a cross-sectional view taken along the I-I line in FIG. 4. The first conductive pattern 27 is a ground pattern, and a planar shape thereof is a solid shape as shown in FIG. 4.

Figure 5:
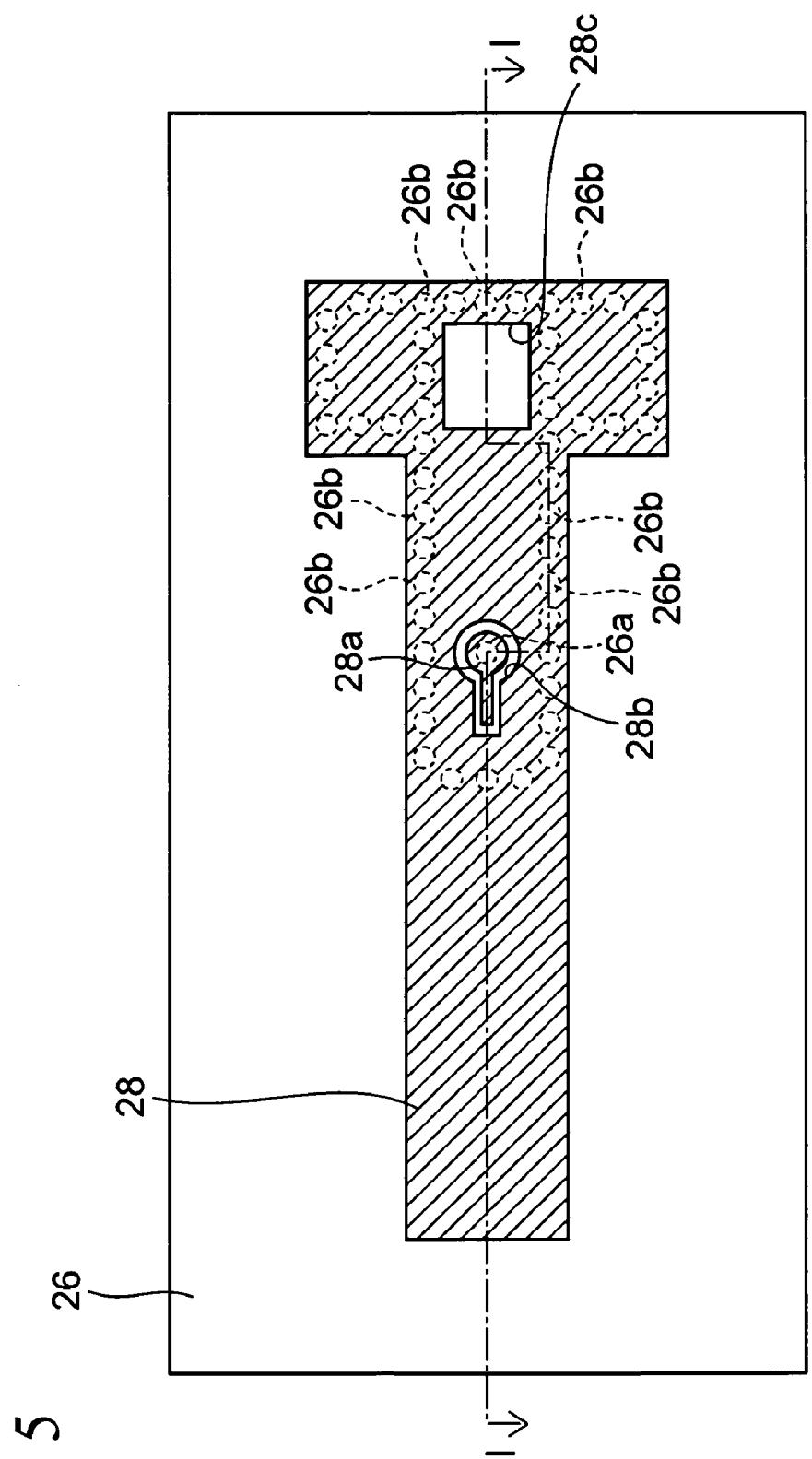
FIG. 5 is a plan view of a second conductive pattern of the high-frequency module according to the embodiment of the present invention.

On the other hand, FIG. 5 is a plan view of the second conductive pattern 28. An aperture 28b is formed in the second conductive pattern 28, and an island 28a surrounded by the aperture 28b is formed on the resin base member 26. Moreover, the above-described first through hole 26a is formed below the island 28a, and the island 28a is electrically connected to the first conductive pattern 27 through the first conductor 30 inside this first through hole 26a (see FIG. 3A). Furthermore, a window 28c is provided in the second conductive portion 28 at a portion away from the aperture 28b for passing the high-frequency signal therethrough.

Reference will be made to FIG. 3A again. After forming the first and second conductive patterns 27 and 28 as described above, the surface 26c of the resin base member 26 is attached to the stiffener 22 by use of an adhesive 24 such as epoxy resin.

Here, the stiffener 22 functions as the support substrate for maintaining flatness of the resin base member 26, and the metal foils 21 are formed for reinforcing the stiffener 22. Accordingly, it is not necessary to electrically connect the stiffener 22 and the resin base member 26. For this reason, it is possible to use either an insulative adhesive or a conductive adhesive as the foregoing adhesive 24.

Moreover, when the core base member 20 made of epoxy resin without formation of the metal foils 21 is solely used as the stiffener 22, it is possible to use a semi-hardened prepreg instead of the adhesive 24. In this case, the resin base member 26 is fixed to the core base member 20 by pressing the resin base member 26 against the core base member 20 and thermally hardening the foregoing prepreg at a temperature of about 200° C.

Next, a process for obtaining a cross-sectional structure shown in FIG. 3B will be described.

Firstly, a semiconductor element 32 such as an MMIC, with which a high-frequency signal bump (terminal) 34 and ground bumps (terminals) 35 are provided, is prepared. The semiconductor element 32 for instance has a function to generate or receive a high-frequency signal, and the high-frequency signal bump 34 becomes an input and output terminal for the high-frequency signal. In this embodiment, the semiconductor element 32 is provided with only one high-frequency signal bump 34, and all the other bumps are the ground bumps 35.

Here, the material of the respective bumps 34 and 35 is not particularly limited. However, gold bumps are used in this embodiment.

Then, an ultrasonic wave is applied to the respective bumps 34 and 35 in the state where the high-frequency signal bump 34 abuts on the island 28a and the ground bumps 35 abut on the second conductive pattern 28. Accordingly, these bumps are bonded to the island 28a and to the second conductive pattern 28, respectively. When the resin base member 26 is heated up to or above its softening point Tg (typically 150° C.) in this ultrasonic bonding process, the resin base member 26 is thermally deformed and the respective bumps 34 and 35 cannot be bonded successfully. Therefore, it is preferable to carry out this ultrasonic bonding process at a temperature lower than the above-mentioned softening point Tg such as a room temperature.

In this way, the semiconductor element 32 is electrically and mechanically connected to the second conductive pattern 28 by flip-chip bonding. According to the investigation conducted by the inventor of the present invention, it was confirmed that such a flip-chip bonding process could obtain a bond strength equal to or above a shear strength of 15 g/bump.

In this structure, the ground potential of the first conductive pattern 27 is applied to the semiconductor element 32 through the ground bumps 35 and the second conductors 31.

Meanwhile, the plurality of second conductors 31 formed in the second through holes 26b of the resin base member 26 also have functions to guide heat generated in the semiconductor element 32 to the rear surface of the resin base member 26 and to ease high temperature of the semiconductor element 32 in the actual operation.

Figure 6:
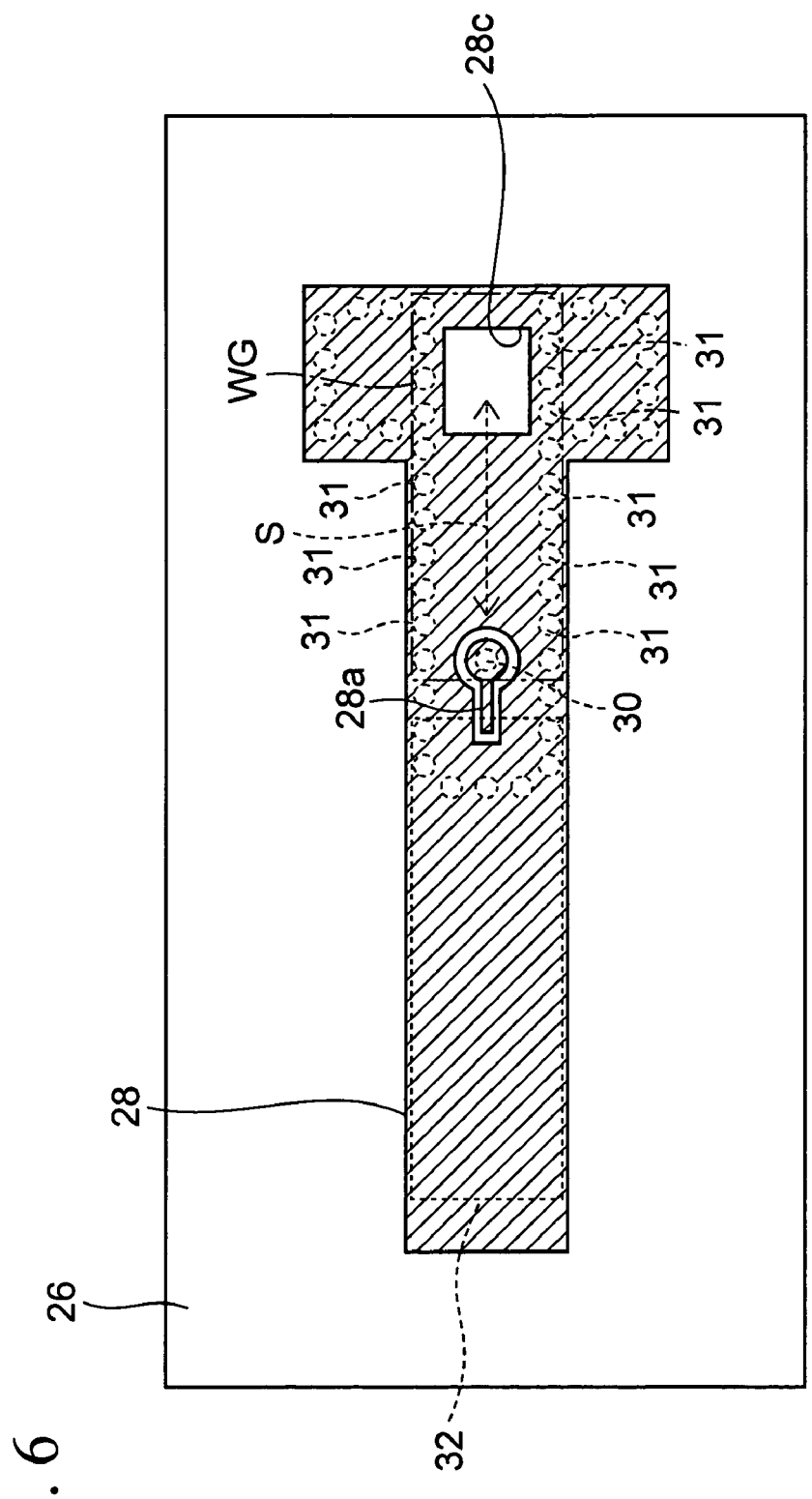
FIG. 6 is a plan view showing the progress of manufacturing the high-frequency module according to the embodiment of the present invention.

FIG. 6 is a plan view of the high-frequency module after completing this process, which is viewed from the side of the second conductive pattern 28. Note that illustration of the stiffener 22 is omitted in FIG. 6.

Figure 3B:
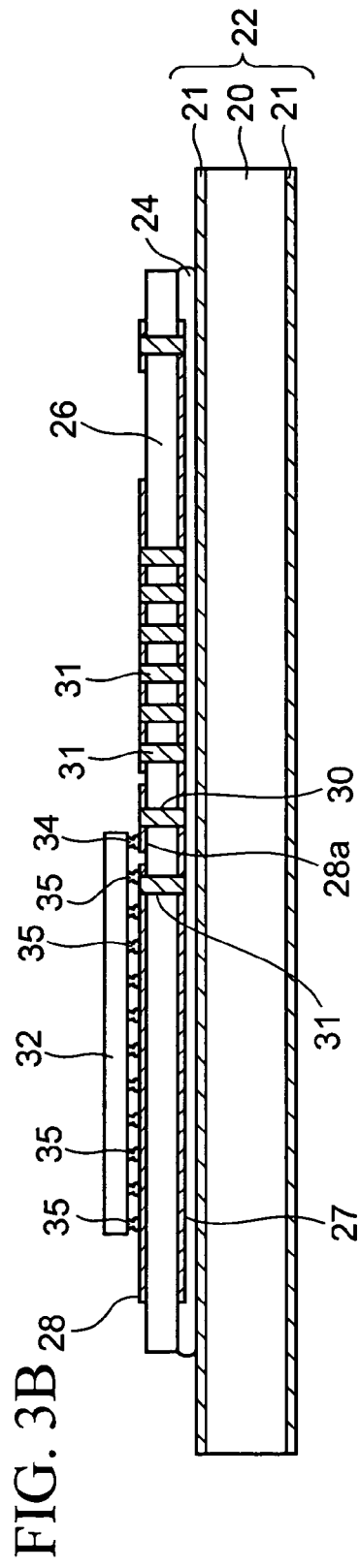

A high-frequency signal S generated or received by the semiconductor element 32 is propagated through the resin base member 26, which is surrounded by the second conductive pattern 28 and by the first conductive pattern 27 (see FIG. 3B). In this case, the second conductors 31 located on both sides of the propagation path function as a side wall for preventing leakage of the high-frequency signal S in the lateral direction of the substrate. Therefore, in this embodiment, the portion of the resin base member 26 surrounded by the first and second conductive patterns 27 and 28 and the second conductors 31 functions as a waveguide WG for guiding the high-frequency signal S. Moreover, the direction of propagation of the high-frequency signal S is changed from the lateral direction of the substrate to the longitudinal direction of the substrate at the window 28c of the second conductive pattern 28 formed at an end of the waveguide WG.

Incidentally, the high-frequency signal S used in this embodiment is in the millimeter waveband. In order to prevent a dielectric loss of the high-frequency signal at this frequency, the resin material having the dielectric loss tangent smaller than 0.01 in the millimeter waveband is used as the material of the resin base member 26 as described previously. In general, the resin material satisfying this characteristic is limited to a low dielectric material having a dielectric constant $\in$ below 4.

However, when the waveguide WG is made of the low dielectric material as described in this embodiment, in order to obtain the same characteristic impedance $Z_0$ as that of a waveguide made of a high dielectric material having a dielectric constant $\in$ around 9 such as a ceramic substrate, it is necessary to form the thickness of the waveguide WG, i.e., the thickness of the resin base member 26 substantially thinner than the thickness of the ceramic substrate. This is due to the fact that the characteristic impedance $Z_0$ of the waveguide is an increasing function with respect to the dielectric constant $\in$ of the substrate and a decreasing function with respect to the thickness H of the substrate. Accordingly, when the dielectric constant $\in$ becomes smaller, the characteristic impedance $Z_0$ falls below a value necessary for impedance matching unless the thickness H is reduced.

As a result, in this embodiment, the thickness of the resin base member 26 is reduced to a range of about 100 to 400 μm, and the resin base member 26 becomes quite soft. Therefore, in an attempt to perform flip-chip bonding of the semiconductor element 32 on the resin base member 26 alone (see FIG. 3B), the resin base member 26 may be warped and it is difficult to apply uniform pressure to the respective bumps 34 and 35. As such, there is concern about reliability of bond strengths of the bumps. Moreover, even when the bumps 34 and 35 were to be bonded to the second conductive pattern 28, deformation of the resin base member 26 attributable to mechanical force or heat in the manufacturing process would incur detachment of the bumps 34 and 35 from the second conductive pattern 28.

In light of these consideration, in this embodiment, flatness of the resin base member 26 is favorably maintained by fixing the resin base member 26 in advance onto the stiffener 22 as shown in FIG. 3B, which has higher rigidity than the resin base member 26 by the action of the metal foils 21, and the semiconductor element is attached by flip-chip bonding in this state. In this way, even if the semiconductor element 32 is pressed against the resin base member 26 in the course of flip-chip bonding, the stiffener 22 functions to prevent deformation of the resin base member 26.

Accordingly, the semiconductor element 32 is attached by flip-chip bonding while flatness of the resin base member 26 is maintained. In this way, it is possible to prevent uneven bond strengths among the respective bumps 34 and 35 and thereby to enhance reliability of connection between the semiconductor element 32 and the second conductive pattern 28.

In addition, even after the semiconductor element 32 is bonded, deformation of the resin base member 26 in the course of the manufacturing process is prevented by the stiffener 22. In this way, it is possible to prevent the bond strengths of the bumps 34 and 35 from becoming weaker in the course of the manufacturing process.

Subsequently, as shown in FIG. 3C, cyanate-epoxy resin is adopted as an underfiller 37, and the underfiller 37 is filled in a space between the semiconductor element 32 and the second conductive pattern 28. Thereafter, the underfiller 37 is heated and softened on a hot plate (not shown), and is filled below the semiconductor element 32 by use of a capillary phenomenon. Then, the bond strength between the semiconductor element 32 and the second conductive pattern 28 is further enhanced by hardening the underfiller 37 in an oven set to a temperature of 150° C.

The inventor of the present invention has conducted a thermal cycle test between −55° C. and 150° C. in order to confirm the bond strength. As a result, after carrying out this test for 3000 cycles or more, an increase in contact resistance between the respective bumps 34 and 35 and the second conductive pattern 28 remained 10% or less of contact resistance before the test. In this way, it was verified that sufficient connection reliability could be obtained.

Note that this example employs a so-called "last-in method" in which the underfiller 37 is filled after the semiconductor element 32 is mounted. However, the present invention is not limited to this. For example, it is also possible to employ a so-called "first-in method" configured to connect the gold bumps 35 and the second conductive pattern 28 by firstly coating non-conductive paste (NCP) on the second conductive pattern 28 and then pressing the semiconductor element 32 onto the NCP. In this "first-in method", it was verified that connection reliability was not deteriorated even after a thermal cycle test is performed under a similar temperature condition to the above-described test for 1000 cycles or more.

Next, as shown in FIG. 3D, a plastic cap 39 including an electromagnetic wave absorber 39a attached to an inner surface thereof is adhered to the second conductive pattern 28 by use of an adhesive, and the semiconductor element 32 is covered with the cap 39. The electromagnetic wave absorber 39a is a sheet-shaped seal made by dispersing, for example, ferrite particles into resin. The electromagnetic wave absorber 39a has functions to absorb the high-frequency signal generated or received by the semiconductor element 32 and to prevent leakage of the high-frequency signal to outside.

Instead of forming the cap 39 by use of a plastic, it is also possible to form the cap 39 by use of metal such as aluminum. In this case, the cap 39 by itself has a function to reflect the high-frequency signal and to confine the high-frequency signal in the cap 39. Accordingly, it is not necessary to provide the electromagnetic wave absorber 39a in this case.

Although the cap 39 is adhered to the second conductive pattern 28 in this example, it is also possible to house the second conductive pattern 28 partially in the cap 39 within the design allowance and to fix part of the cap 39 onto the insulative base member 26.

Figure 7:
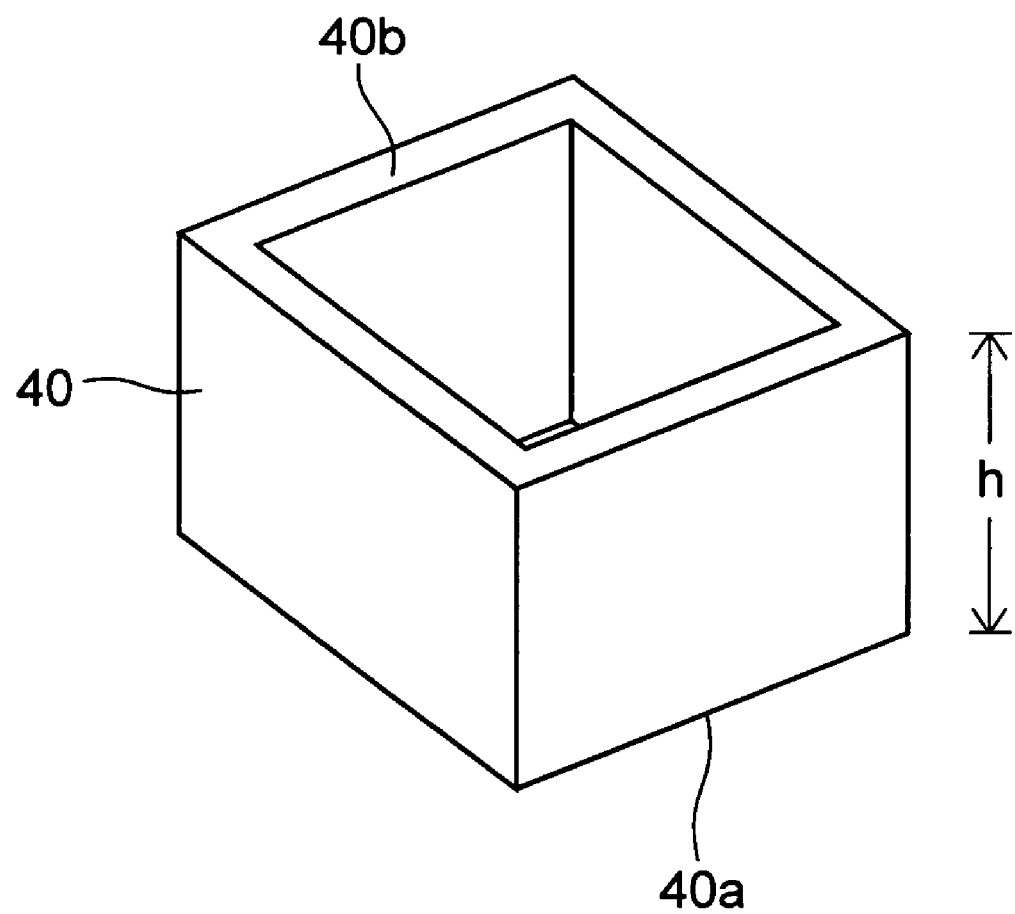
FIG. 7 is a perspective view of an adopter (a waveguide tube) used in the high-frequency module according to the embodiment of the present invention.

FIG. 7 is a perspective view of an aluminum adopter (a waveguide tube) 40 used in the subsequent process. The adopter 40 is made of a rectangular tube having a rectangular cross-section and a height h of 3 mm, for example.

In this process, as shown in FIG. 3E, the adopter 40 is fixed to the second conductive pattern 28 by use of an adhesive (not shown) such that one open end 40a of the adopter 40 surrounds the window 28c of the second conductive pattern 28. In addition to a function to guide the high-frequency signal S coming into or going out of the window 28c, the adopter 40 needs to pass a direct-current component of a signal flowing in the second conductive pattern 28. For this reason, a conductive adhesive is used as the adhesive for attaching the adopter 40 to the second conductive pattern 28. Alternatively, it is also possible to achieve electric connection between the second conductive pattern 28 and the adopter 40 by forming a screw hole penetrating the second conductive pattern 28 and the resin base member 26 and fastening the adopter 40 to the screw hole by use of a metal screw instead.

Next, a process for obtaining a cross-sectional structure shown in FIG. 3F will be described.

Firstly, a lower support plate 42 and an upper support plate 44 are attached to both surfaces of a flat antenna 43 made of aluminum by use of an adhesive (not shown), and the laminated body is made into an antenna module 45. Of the respective support plates 42 and 44, the lower support plate 42 is provided with a hole 42a for passing the high-frequency signal S. Here, the material of the support plates 42 and 44 is not particularly limited. However, aluminum plates having the same thermal expansion coefficient as the antenna 43 and the adopter 44 are preferably used as the support plates 42 and 44.

Next, the other open end 40b of the adopter 40 is attached to the periphery of the hole 42a of the lower support plate 42 by use of an unillustrated adhesive. It is to be noted, however, that a direct-current component of a signal flowing in the adopter 40 needs to be supplied to the lower support substrate 42. Accordingly, a conductive adhesive is used as the adhesive in this case.

In this way, the basic structure of the high-frequency module according to the embodiment is finished.

Although it is not specified herein, pads connected to the first and second conductive patterns 27 and 28 are formed on the resin base member 28 in this high-frequency module, and the pads are wire bonded to terminals of a mother board.

In addition, although the function of the flat antenna 43 constituting this high-frequency module is not particularly limited, the flat antenna 43 is used as a radar antenna in this embodiment. Moreover, a radar high-frequency signal is irradiated from the flat antenna 43 onto a target such as an automobile, and the reflected high-frequency signal is received by the flat antenna 43. Thereafter, the high-frequency signal is processed by the semiconductor element 32 to calculate a distance to the target, and the result of calculation is transmitted to a driver, for example.

According to the high-frequency module, as shown in FIG. 3F, the antenna 43 is placed on the same side A as the semiconductor element 32 when seen from the stiffener 22.

On the contrary, it is also conceivable to place the antenna 43 on the opposite side B to the semiconductor element 32. In this case, a though hole for inserting the adopter 40 must be formed in the stiffener 22.

However, forming a hole in the stiffener 22 with high precision requires a high cost and thereby incurs an increase in the manufacturing costs of the high-frequency module. Accordingly, such a process is not favorable.

On the contrary, present embodiment does not require the hole forming process for the stiffener 22. In this way, it is possible to provide the high-frequency module while suppressing the manufacturing costs.

Moreover, the high-frequency module uses the inexpensive resin base member 26. Accordingly, the high-frequency module does not require the expensive ceramic substrate 2 as in FIG. 1, as well as the costly hole forming process for the ceramic substrate. Therefore, it is possible to manufacture the high-frequency module of the present embodiment at the cost which is about one-tenth as much as the cost for the high-frequency module described in FIG. 1 or below.

In addition, the high-frequency signal S passes through the waveguide WG (see FIG. 6) and the adopter 40. Accordingly, it is also possible to reduce signal losses which are observed in the example shown in FIG. 1, where the high-frequency signal pass through the gold ribbons 6.

As a result of actual measurement of high-frequency characteristics of this high-frequency module conducted by the inventor of the present invention, no signal losses or abnormal high-frequency characteristics were confirmed. Instead, characteristics equivalent to the case of using the ceramic substrate and a metal stiffener were confirmed.

3 Comparative Example

Figure 8:
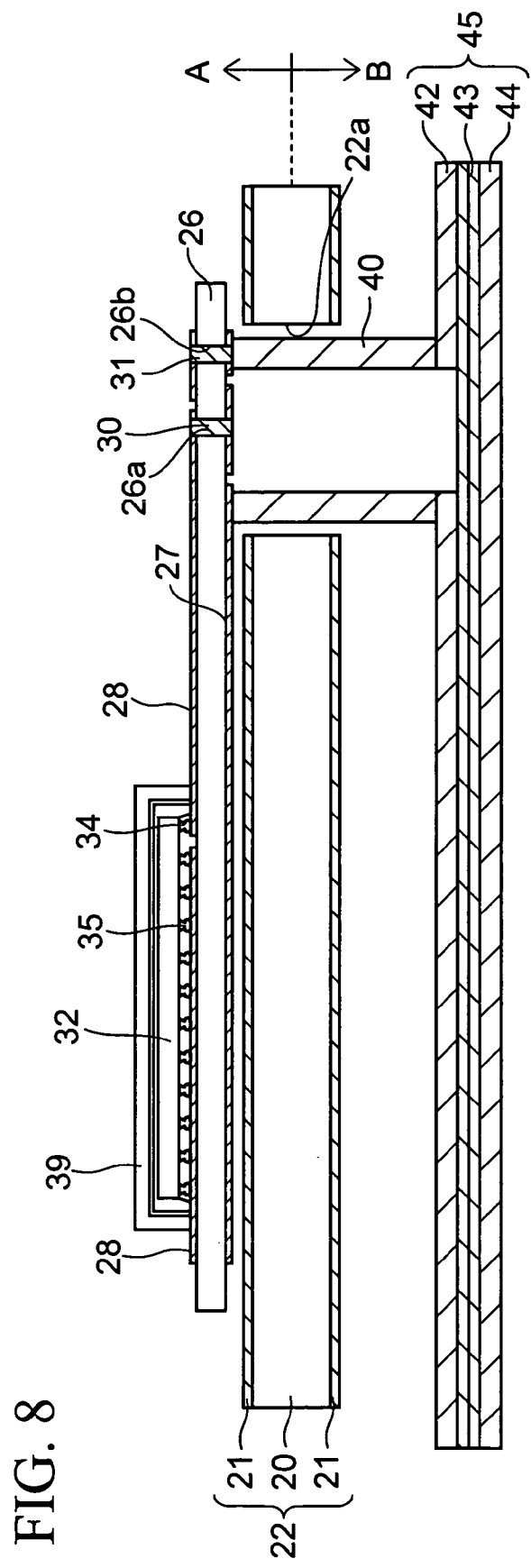
FIG. 8 is a cross-sectional view of a high-frequency module according to a comparative example.
Figure 9:
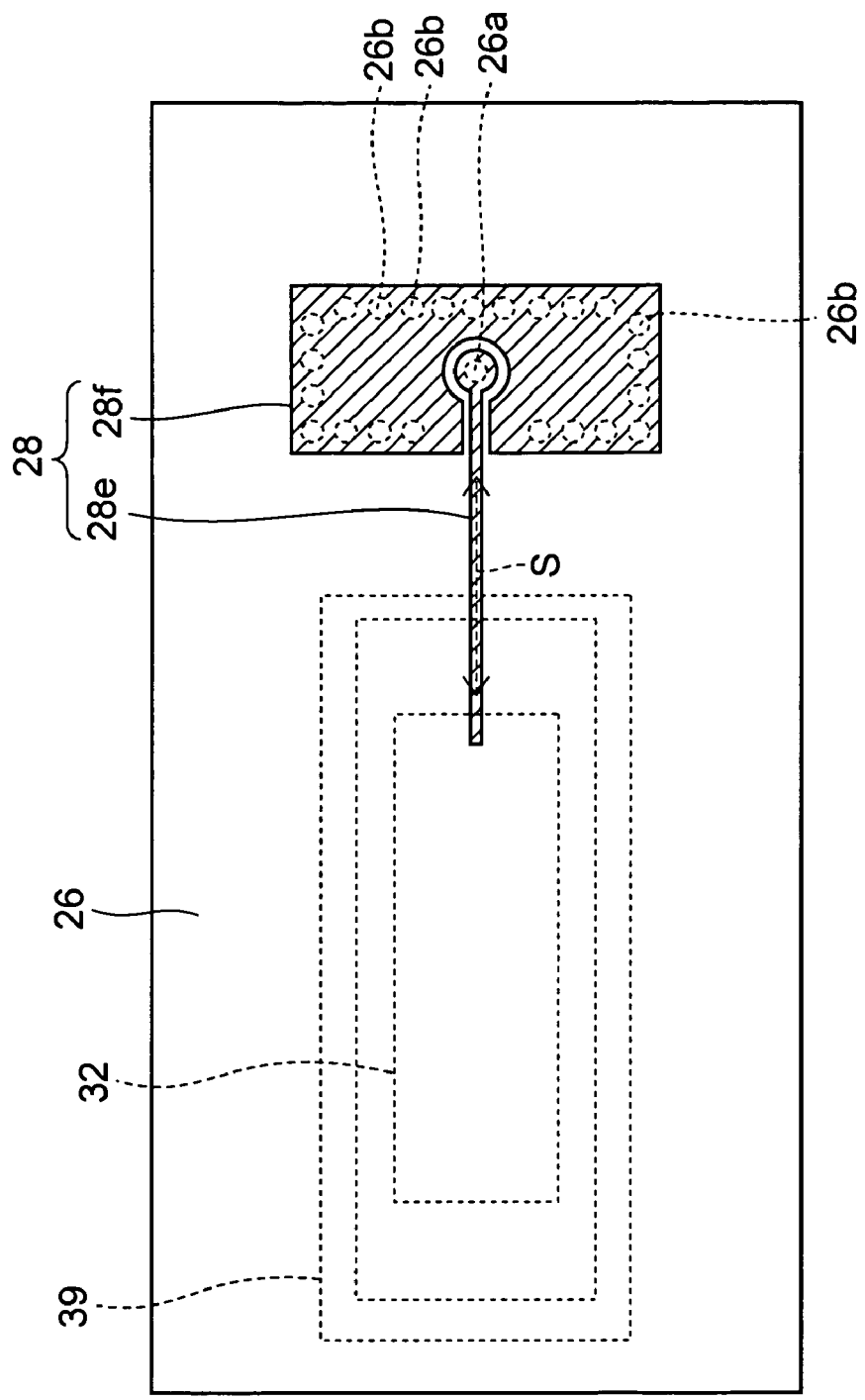
FIG. 9 is a plan view of the high-frequency module according to the comparative example viewed from the side where a semiconductor element is mounted.
Figure 10:
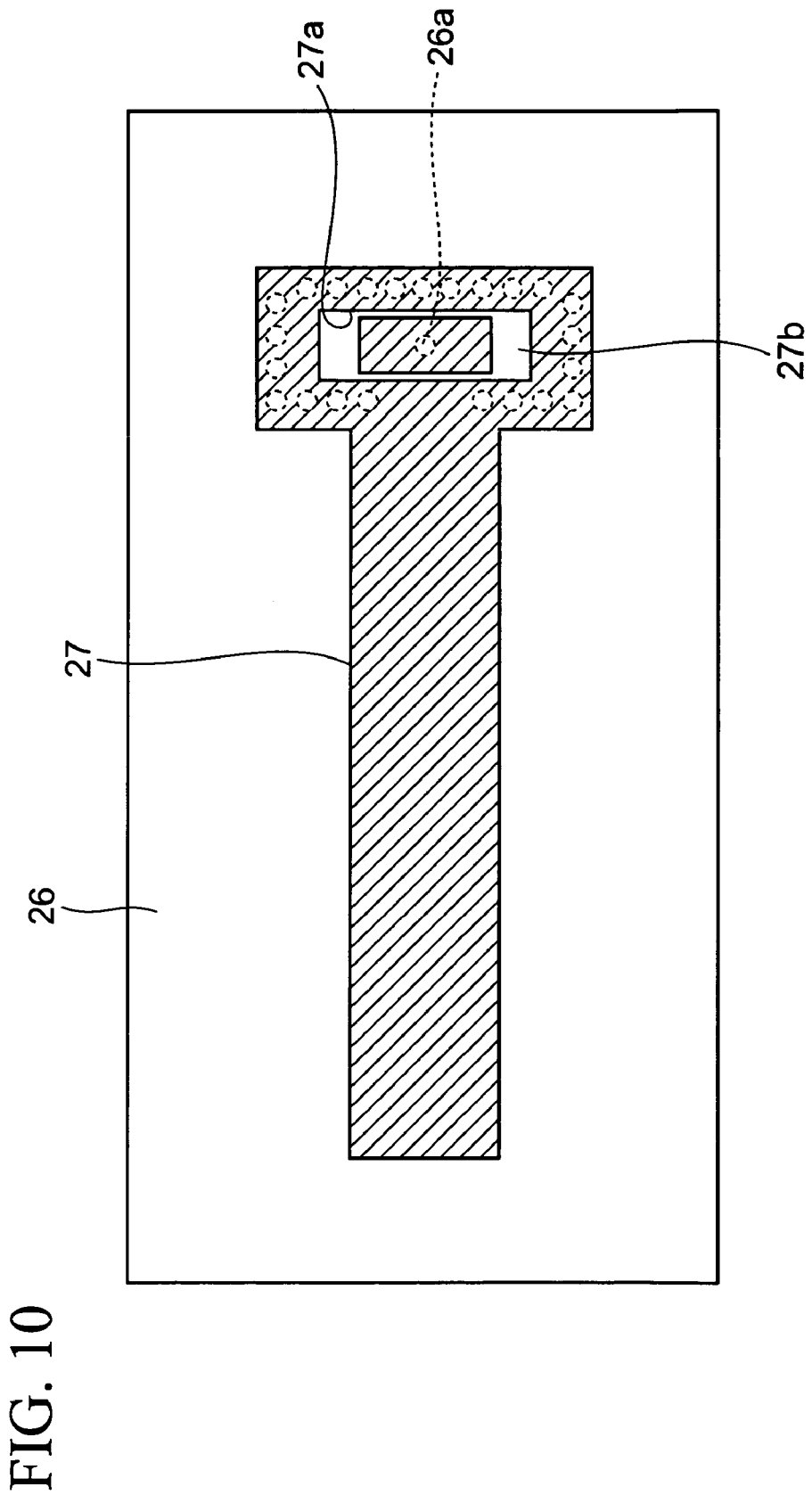
FIG. 10 is a plan view of the high-frequency module according to the comparative example viewed from the opposite side of the semiconductor element.

FIG. 8 is a cross-sectional view of a high-frequency module according to a comparative example, and FIG. 9 and FIG. 10 are plan views thereof. Note that the constituents described in the above embodiment will be designated by the same reference numerals in these drawings, and description of these constituents will be omitted herein.

This comparative example describes the case of placing the antenna 43 on the opposite side B to the semiconductor element 32 when seen from the stiffener 22 as explained in the last part of the embodiment.

In this case, a through hole 22a for inserting the adopter 40 is required. Accordingly, the manufacturing costs of this high-frequency module are increased by the cost of forming the through hole.

Moreover, in this comparative example, as shown in FIG. 9, a line 28e is formed on the second conductive pattern 28 for allowing the high-frequency signal S to flow, and the first through hole 26a for taking the high-frequency signal S out to the rear surface of the resin base member 26 is formed in a terminal end of the line 28e. Moreover, the signal S taken out to the rear surface of the resin base member 26 reaches an island 27b formed in the first conductive pattern 27 as shown in FIG. 10. The island 27b is surrounded by a window 27a formed in the first conductive pattern 27, and the high-frequency signal S is taken out of the window 27a in the longitudinal direction of the substrate.

In this structure, the high-frequency signal S is guided by the line 28e as shown in FIG. 9. Accordingly, the high-frequency signal S is apt to leak out of the line 28e, which is likely to cause a loss of the signal S.

On the contrary, in the embodiment of the present invention, the high-frequency signal S is guided into the waveguide WG which is surrounded by the conductors as described in FIG. 6. Accordingly, it is possible to moderate the loss of the high-frequency signal S as compared to the case of adopting the line as shown in the comparative example.

According to the present invention, the semiconductor element and the antenna are placed on the same side of the support substrate. Therefore, it is not necessary to form the through hole in the support substrate for passing the waveguide tube. In this way, it is possible to reduce the cost required for the hole forming process on the support substrate and thereby to provide the high-frequency module while the manufacturing costs are reduced.

Moreover, since the resin base member is supported by the support substrate, it is possible to mount the semiconductor element on the resin base member while flatness thereof is maintained, and thereby to enhance reliability of the semiconductor and the resin base member.

In addition, since the hole forming process for the resin base member can be achieved at a lower cost than that for the ceramic substrate, it is possible to suppress an increase in the manufacturing costs of the high-frequency module even when the first and second through holes are formed in the resin base member.

What is claimed is:

1. A high-frequency module comprising:
   a support substrate;
   a resin base member whose one surface is fixed to the support substrate;
   a first conductive pattern formed on said one surface of the resin base member;
   a second conductive pattern formed on the other surface of the resin base member, the second conductive pattern constituting a waveguide in corporation with the first conductive pattern to pass a high-frequency signal in the resin base member and including a window for allowing entrance and exit of the high-frequency signal;
   a semiconductor element, either transmitting or receiving the high-frequency signal, mechanically and electrically connected onto the second conductive pattern at an interval from the window;
   a waveguide tube fixed onto the second conductive pattern such that one open end thereof surrounds the window; and
   an antenna fixed to the other open end of the waveguide tube.

2. The high-frequency module according to claim 1, wherein the support substrate has higher rigidity than the resin base member.

3. The high-frequency module according to claim 1, wherein an aperture is formed in the second conductive pattern at a portion away from the window,
   the second conductive pattern includes an island surrounded by the aperture, and
   the semiconductor element includes a high-frequency signal terminal bonded to the island.

4. The high-frequency module according to claim 3, wherein a first through hole for the high-frequency signal is formed in the resin base member below the island, and
   a first conductor for the high-frequency signal for electrically connecting the island and the first conductive pattern is formed in the first through hole.

5. The high-frequency module according to claim 1, wherein a plurality of second through holes are formed in the resin base member at a portion between the window of the second conductive pattern and the semiconductor element along both sides of the waveguide, and
   second conductors for electrically connecting the first conductive pattern and the second conductive pattern are formed in the second through holes.

6. The high-frequency module according to claim 5, wherein the second conductors function as a side wall of the waveguide.

7. The high-frequency module according to claim 5, wherein the first conductive pattern is a ground pattern.

8. The high-frequency module according to claim 1, further comprising:
   a cap covering the semiconductor element and either absorbing or reflecting the high-frequency signal emitted from the semiconductor element.

9. The high-frequency module according to claim 1, wherein the high-frequency signal is a high-frequency signal in a millimeter waveband.

10. The high-frequency module according to claim 1, wherein the antenna is a radar flat antenna.

* * * * *